(12) United States Patent
Chung

(10) Patent No.: US 7,038,971 B2
(45) Date of Patent: May 2, 2006

(54) MULTI-CLOCK DOMAIN DATA INPUT-PROCESSING DEVICE HAVING CLOCK-RECEIVING LOCKED LOOP AND CLOCK SIGNAL INPUT METHOD THEREOF

(75) Inventor: Dae-Hyun Chung, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 573 days.

(21) Appl. No.: 10/288,540

(22) Filed: Nov. 6, 2002

(65) Prior Publication Data

US 2003/0199262 A1    Oct. 23, 2003

(30) Foreign Application Priority Data

Apr. 23, 2002   (KR) .......................... 2002-0022260

(51) Int. Cl.
*G11C 8/00* (2006.01)
(52) U.S. Cl. .................. 365/233; 365/189.05; 365/194
(58) Field of Classification Search ..................... None
See application file for complete search history.

(56) References Cited

U.S. PATENT DOCUMENTS

| | | | | |
|---|---|---|---|---|
| 5,896,347 A | * | 4/1999 | Tomita et al. | ............... 365/233 |
| 5,978,281 A | * | 11/1999 | Anand et al. | .......... 365/189.05 |
| 6,064,625 A | * | 5/2000 | Tomita | ........................ 365/233 |
| 6,178,138 B1 | | 1/2001 | Derbenwick et al. | |
| 6,229,757 B1 | * | 5/2001 | Nagata et al. | ............... 365/233 |
| 6,324,119 B1 | * | 11/2001 | Kim | ........................... 365/233 |
| 6,407,963 B1 | * | 6/2002 | Sonoda et al. | ........... 365/233.5 |
| 6,498,766 B1 | * | 12/2002 | Lee et al. | ..................... 365/233 |
| 6,639,868 B1 | * | 10/2003 | Kim et al. | ................... 365/233 |
| 6,707,726 B1 | * | 3/2004 | Nishio et al. | .......... 365/189.12 |
| 6,728,162 B1 | * | 4/2004 | Lee et al. | ..................... 365/233 |
| 6,775,190 B1 | * | 8/2004 | Setogawa | .................... 365/193 |

OTHER PUBLICATIONS

*Title: "A Skew and Jitter Suppressed DLL Architecture for high frequency DDR SDRAMs".

* cited by examiner

*Primary Examiner*—Son Mai
(74) *Attorney, Agent, or Firm*—Lee & Morse, P.C.

(57) ABSTRACT

A multi-clock-domain data input processing device preferably includes: a clock-signal-receiving synchronous circuit that generates an output clocking signal by phase-delaying a first clock signal; a data input part having a delay locked loop (DLL); and an input-processing part. The data input part preferably inputs data in response to the first clock signal and the input-processing part transfers data in response to a second clock signal having a timing different from that of the first clock signal. A clock-signal applying method for operating the multi-clock-domain data input-processing device preferably includes the steps of: applying a plurality of clock signals to a signal-receiving clock conversion part; and applying a delayed clocking signal outputted from the DLL to the remaining parts of the data input-processing device.

21 Claims, 15 Drawing Sheets

MULTI-CLOCK DOMAIN DATA INPUT-PROCESSING DEVICE HAVING CLOCK-RECEIVING LOCKED LOOP AND CLOCK SIGNAL INPUT METHOD THEREOF

BACKGROUND OF THE INVENTION

1. Field of the Invention

The present invention relates to a data input-processing method applicable to a data input-processing unit, such as a microprocessor or synchronous semiconductor memory device. More particularly, the present invention relates to a multi-clock domain data input-processing unit having a clock signal receiving locked loop (a clock signal receiving synchronous circuit) and the related clock signal applying method.

2. Description of the Related Art

As the operational speed of a central processing unit (CPU) for controlling the operations of a computer system increases, a synchronous dynamic random access memory (hereinafter referred to as SDRAM) that operates synchronously with an external clock is widely used. Specifically, a device known as 2 bit pre-fetch type SDRAM is typically used, since the device can write and read 2 bit data simultaneously. In case of the 2 bit pre-fetch type SDRAM, it is necessary to provide faster clock signals which typically introduce timing skews between a clock signal and a data input signal. In order to correct for such timing skew, a double data rate (hereinafter referred to as DDR) SDRAM has been introduced which captures a data input signal using a data strobe signal and a doubled clock cycle. Standardization of DDR-SDRAM is governed by Joint Electronic Device Engineering Council (JEDEC).

In data input-processing units, such as the DDR-SDRAM, micro-processor and the like, a clock signal, a main signal-receiving clock signal, and data strobe signal are used to input applied input data into the unit. The use of a plurality of clock signals for input operations of the data input-processing unit is defined as a use of a "multi-clock domain" in the following descriptions. When using a multi-clock domain, it is necessary to generate a timing budget as the frequency of the operational clock increases. One technique for generating such a timing budget is to create an internal clock using a phase locked loop (PLL) or delay locked loop (DLL). In a case of the PLL or DLL, consideration should be given to a timing margin in a signal-receiving clock conversion part, wherein one clock signal is converted into another clock signal.

FIG. 1 illustrates a block diagram of a conventional data input-processing unit including a first processing block (hereinafter referred to as memory controller 100) and a second processing block 200. Although such a system typically has a bi-directional data strobe function, wherein first processing block 100 provides data and a data strobe signal to second processing block 200, and the second processing block 200 provides data and a data strobe signal to the first processing block 100, for purposes of brevity in this discussion, only the forward path from first processing block 100 to second processing block 200 will be discussed. It may be understood that the reverse path has a duplicate description.

Data supplied from an input/output processing unit 110 of the memory controller 100 is applied to an input buffer 202 through a first signal-transmitting buffer 112, and a data strobe signal DS supplied from the input/output processing unit 110 is applied to an input buffer 208 through a second signal-transmitting buffer 114. A command signal CMD supplied from the input/output processing unit 110 is applied to an input buffer 212 through a third signal-transmitting buffer 119, and, a clock signal CLK applied from an input node N1 is applied to an input buffer 210. A signal-receiving clock conversion part (CCP) 216, uses a multi-clock domain to input data via first and second latches 204 and 206, respectively. First latch 204 latches data received through the input buffer 202 in response to a data strobe signal received at the strobe terminal through the input buffer 208, and second latch 206 latches data output through an output terminal Q of the first latch 204 in response to a clock signal CLK received at a clock terminal through the input buffer 210. Thus, the data strobe signal DS is used as a clock domain of the first latch 204, and the clock signal CLK is used as a clock domain of the second latch 206.

Next, a timing margin of a signal-receiving clock conversion part CCP will be described with reference to FIG. 2, which illustrates an operational timing diagram of the CCP 216 shown in FIG. 1. As shown in FIG. 2, when the data strobe signal DS is applied through the input buffer 208 (waveform A), a data waveform B is delayed relative to waveform A by time interval T1 at an output terminal of the first latch 204, due to data waveform B being applied to the input buffer 202 in synchronization with a signal-transmitting clock of a signal-transmitting delay locked loop 117. The clocking signal applied to the second latch 206 (waveform C) is typically characterized as having a time delay interval T2, which is due to a mismatch between the paths of the clock signal and the data strobe signal in the second processing block 200. As a result, a standard timing specification, known as tDQSS, which shows a difference in the timing between data strobe signal and clock signal, is obtained by subtracting time intervals T1 and T2 from one period of the clock signal CLK, tCC. For instance, in a DDR-SDRAM using a data strobe signal, a tDQSSmin and tDQSSmax are defined and managed as timing specifications in order to keep the standard tDQSS within a regulated range.

At this time, in order to provide a more thorough understanding about the time interval T1 shown in FIG. 2, the function of a signal-transmitting delay locked loop (T_DLL) will be described with reference to FIGS. 3 and 4.

FIG. 3 illustrates a block diagram of a conventional SDRAM 300 having a signal-transmitting delay locked loop T_DLL 330 and a bi-directional data strobe function. FIG. 4 illustrates a timing diagram of a data output operation of the signal-transmitting delay locked loop shown in FIG. 3.

The output data applied to a data output circuit 340 through a data bus from a SDRAM core 310 is output through an output terminal P1 by synchronizing with an internal clock dll_clk, which is generated by T_DLL 330, rather than an external clock. As shown in FIG. 4, if data (dout) is output by synchronizing with the external clock, a skew is created having a time delay td1. Thus, a new clock needs to be generated that precedes external clock CLK by the time delay td1 in order to compensate for this skew. When T_DLL 330 is adapted to generate internal clock dll_clk to provide this compensation, the output data (dout) supplied to the output terminal of the data output circuit 340 becomes synchronized with the external clock CLK, but without a skew. More specifically, dll_clk is a clock obtained by delaying the external clock CLK by as much as time interval td2. As a result, td2=tCC−td1, and the resultant clock is effectively a clock that precedes CLK by as much as td1.

During a write operation, when write data DIN as shown in FIG. 3 is applied, the data input circuit 320 inputs the write data signal and provides it to a data bus in response to signal-transmitting clock signal CLK and data strobe signal DS. The data provided is thus stored in selected memory cells in the SDRAM core 310.

In order to provide a thorough understanding about detailed operations of the write operational mode and the timing specification of the standard tDQSS in a case of a DDR-SDRAM using a data strobe signal, the write operation of a general DDR-SDRAM will be described with reference to FIGS. 5 and 6.

FIG. 5 illustrates a block diagram of a conventional DDR-SDRAM. FIG. 6 illustrates an operational timing diagram of the write operations of the DDR-SDRAM shown in FIG. 5.

As shown in FIGS. 5 and 6, a DDR-SDRAM is constructed with memory cell arrays 1, 2, word drivers 3, 4, I/O circuits 5A, 6A, write circuits 7, 8, sense amplifier 9, 10, 11, 12, column decoders 13, 14, command decoder 15A, burst counter 16A and column control circuit 17A. As shown in FIG. 6, if a write command is input to a command input port CMD, a data strobe signal DS is applied to I/O circuits 5A, 6A in order to enable the standard tDQSS, which shows the timing difference between data strobe signal DS and clock signal CLK. This timing difference is typically maintained within a regulated range. Assuming that write data D0, D1, D2 and D3 are input as indicated by waveform DQ in FIG. 6 in response to rising and falling edges of the data strobe signal DS, write operation controlling signals W0, W1 are output from column control circuit 17A after a predetermined time interval (for instance, a timing interval of 2 clocks after an input of a command) in response to a read/write command RWCMD output by the command decoder 15A.

On the other hand, when address inputs IA0–IAj are generated in correspondence to addresses A0–Aj designated by CPU, address signals YP0–YPj are output from the burst counter 16A in response to address control signal YALW supplied by the command decoder 15A. After one clock period, an address obtained by adding as much as 2 to the address signals YP0–YPj is output from the burst counter 16A in response to an address control signal NYAL. At this time, data D0 designated by even numbers and data D1 designated by odd numbers are output from data input/output circuits 5A, 6A as data outputs RWBS and RWBSB in response to the write operation control signals W0, W1, respectively. After the data D0, D1 are output from write circuits 7, 8 as write inputs IO and IOB, they are written to memory cells of column selection lines CSL0 and CSL1 designated by addresses YP0, YP1. Then, the data D2, D3 output as write inputs IO and IOB are written to memory cells of column selection lines CSL2 and CSL3 defined by addresses YP0, YP1(+2).

In the DDR-SDRAM described above, data strobe signals and signal-receiving clock signals are all used for write operations. Therefore, it is known that multi-clock domain is used in the DDR-SDRAM. Thus, a signal-receiving clock conversion part shown in the block 200 of FIG. 1 is required in an I/O circuit, such that the standard tDQSS may be managed to remain within its regulated range.

FIGS. 1, 3 and 5 illustrate a conventional scheme having signal-transmitting DLL only for a case of a data transmission. The signal-receiving DLL is typically required at an input unit if a signal-receiving operation requires a higher frequency. Further, it may be necessary to apply a unidirectional data strobe signal and signal-receiving DLL in order to secure timing estimation.

In a case that the aforementioned details are needed for high frequency operations, except the aforementioned factors (time intervals T1 and T2) described in FIG. 2, the timing margin cannot be sufficiently secured in the signal-receiving clock conversion part due to a jitter caused by the signal-receiving DLLs (R_DLL and DS_DLL.) In other words, jitter in the DLLs complicates high frequency operations.

Therefore, when a signal-receiving DLL (R_DLL and DS_DLL) are adapted into a data input part for high frequency operations, there needs to be an improvement in data input-processing unit and a clock signal applying method that can sufficiently secure a timing margin at the signal-receiving clock conversion part.

SUMMARY OF THE INVENTION

It is a feature of an embodiment of the present invention to provide a multi-clock domain data input-processing unit having a clock signal-receiving synchronous circuit such as a Delay Locked Loop (DLL) or Phase Locked Loop (PLL) and a method for applying clock signal thereto.

It is another feature of an embodiment of the present invention to provide a data input-processing unit and the related clock signal applying method that can secure a maximized timing margin for a signal-receiving clock conversion part when the DLL is adapted for the phase control of clock signal or data strobe signal for high frequency operations.

It is still another feature of an embodiment of the present invention to provide a semiconductor memory device that can reduce restrictions on its high frequency operations by securing a maximized timing estimation of a data input-processing unit.

It is yet another feature of an embodiment of the present invention to provide a clock signal applying method and data input-processing unit that can secure a maximized timing margin at the clock conversion part of the unit to which data is inputted by adopting a signal-receiving DLL and using a multi-clock domain.

It is a further feature of an embodiment of the present invention to provide a method that can secure a maximized timing margin of a signal-receiving clock conversion part in a DDR-SDRAM having a DLL installed to control the delay of signal-receiving clock signal and data strobe signal.

It is yet another feature of an embodiment of the present invention to provide a high frequency operating DDR-SDRAM having a signal-receiving DLL that has an improvement in the timing margin of the clock conversion part.

In a preferred embodiment of the present invention, a data input-processing unit preferably includes: a clock signal-receiving synchronous circuit that generates a signal-receiving internal clock as an output clock signal by phase-delaying a first clock signal by a predetermined time; a data input part that inputs data in sequential response to the first clock signal applied when data is applied and a second clock signal having a timing different from the first clock signal; and an input-processing part that processes data output from the data input part using the signal-receiving internal clock signal of the clock signal-receiving synchronous circuit, the output clock signal of the clock signal-receiving synchronous circuit and the second clock signal. If the first clock signal is a data strobe signal applied from outside, the second clock signal is preferably an external clock signal. The data input part preferably further includes: a first latch which latches the data in response to the first clock signal;

a second latch which latches the data output from the first latch in response to the second clock signal.

According to a second embodiment of the present invention, a data input-processing unit preferably includes: a clock signal-receiving synchronous circuit that generates a signal-receiving internal clock as an output clock signal by phase-delaying a first clock signal by a predetermined time; a data input part that inputs data in sequential response to the first clock signal that is applied when data is applied and a second clock signal having a timing different from that of the first clock signal; and an input-processing part that processes data output from the data input part using the signal-receiving internal clock of the clock signal-receiving synchronous circuit. If the first clock signal is a data strobe signal applied from outside, the second clock signal is preferably an external clock signal. The data input part preferably includes a first latch which latches the data in response to the first clock signal and a second latch which latches the data output from the first latch in response to the second clock signal. The clock signals applied to the data input part are preferably applied directly without passing through the clock signal-receiving synchronous circuit and the clock signals applied to the input-processing part pass through the clock signal-receiving synchronous circuit.

According to a third embodiment of the present invention, a data input-processing unit preferably includes: a clock signal-receiving synchronous circuit constructed having a first DLL that generates a first output clock signal by phase-delaying a first clock signal by a predetermined time and is applied when data is applied, and a second DLL that generates a signal-receiving internal clock as a second output clock by phase-delaying the second clock signal having a timing different from that of the first clock signal; a data input part which inputs the data in sequential response to the first clock signal directly applied without passing through the clock signal-receiving synchronous circuit; and an input-processing part that processes the data output from the data input part with the first and second output clocks of the clock signal-receiving synchronous circuit. If the first clock signal is a data strobe signal applied from outside, the second clock signal is preferably an external clock signal. The data input part preferably includes a first latch, which latches the data in response to the first clock signal, and a second latch, which latches the data output from the first latch in response to the second clock signal. The data input-processing unit may be a double data rate synchronous dynamic random access memory having a free-running data strobe function.

According to the present invention, a clock signal applying method for a data input-processing unit to which a plurality of clock domains are applied, which has a data signal-receiving part having a DLL installed for at least one clock signal, preferably includes directly applying a plurality of clock signals only to a signal-receiving clock conversion part of the data input-processing unit and applying a clock signal output from the DLL to the remaining parts of the data input-processing unit, other than the signal-receiving clock conversion part. The plurality of clock signals of this method are preferably independently applied from outside of a chip of the data input-processing unit. The plurality of clock signals may be applied after being separated at input terminals of the delay locked loop installed at an internal part of the chip of the data input-processing unit.

The present invention additionally provides a synchronous dynamic random access memory (SDRAM) having a clock signal-receiving synchronous circuit for signal-receiving synchronous control formed separately from a signal-transmitting synchronous circuit, and an input circuit, the input circuit preferably including: a first latch circuit, which latches a write data signal in response to a first clock signal applied when the write data signal is applied during a write operational mode; a second latch circuit, which latches the latched data output from the first latch circuit in response to a second clock signal applied with a timing different from the first clock signal for a signal-receiving clock conversion; and an input-processing part which processes the latched data output from the second latch circuit in response to an output clock signal synchronously controlled on the basis of the second clock signal through the clock signal-receiving synchronous circuit. If the first clock signal is a data strobe signal applied from outside, the second clock signal is preferably an external clock signal. Preferably, in the clock signal-receiving synchronous circuit of the memory, a phase synchronizing loop or a DLL generates a signal-receiving internal clock as an output clock signal by phase-delaying the second clock signal by a predetermined time.

The present invention further provides an alternative SDRAM having a clock signal-receiving synchronous circuit for signal-receiving synchronous control formed separately from a signal-transmitting synchronous circuit, and an input circuit, the input circuit preferably including: a first latch circuit, which latches a write data signal in response to a first clock signal applied when the write data signal is applied during a write operational mode; a second latch circuit, which latches the latched data output from the first latch circuit in response to a second clock signal applied with a timing different from the first clock signal for a signal-receiving clock conversion; and an input-processing part which processes the latched data output from the second latch circuit in response to an output clock signal synchronously controlled on the basis of the first clock signal through the clock signal-receiving synchronous circuit.

In a third embodiment, there is an SDRAM having a clock signal-receiving synchronous circuit for signal-receiving synchronous control formed separately from a signal-transmitting synchronous circuit according to the present invention, and an input circuit, the input circuit preferably including: a first latch circuit, which latches a write data signal in response to a first clock signal applied when the write data signal is applied during a write operational mode; a second latch circuit, which latches the latched data output from the first latch circuit in response to a second clock signal having a timing different from the first clock signal for a signal-receiving clock conversion; and an input-processing part which processes the latched data output from the second latch circuit in response to an output clock signal synchronously controlled on the basis of the first and second clock signals through the clock signal-receiving synchronous circuit.

In a fourth embodiment, there is an SDRAM having first and second DLLs, which perform a signal-receiving clock conversion with application of a plurality of clock domains and generate first and second output clock signals synchronously controlled on the basis of first and second clock signals applied through first and second buffers, respectively, the DLLs constructed separately from a signal-transmitting synchronous circuit according to the present invention, the DLLs preferably including: a first receiver, which receives a write data signal in response to the first output clock signal of the first DLL; a second receiver, which receives a command in response to the second output clock signal of the second DLL; a first latch circuit, which latches the write data signal received at the first receiver in response to the first clock signal applied when the write data signal is input; a second latch circuit, which latches the latched data output from the first latch circuit in response to the second clock signal having a timing different from that of the first clock signal for signal-receiving clock conversion; and an input-processing part, which processes the latched data output from the second latch circuit in response to the first and second output clock signals applied through the DLLs.

According to a structure of the aforementioned unit and method, a plurality of clock signals are directly applied only to a signal-receiving clock conversion part and a clock signal output from the DLL being applied to the remaining parts of the data input-processing unit, other than the signal-receiving clock conversion part. This feature reduces restrictions for high frequency operations by securing a maximized timing margin of the clock conversion part.

BRIEF DESCRIPTION OF THE DRAWINGS

The above and other features and advantages of the present invention will become more apparent upon review of a detailed description of preferred embodiments thereof with reference to the attached drawings in which.

DETAILED DESCRIPTION OF THE INVENTION

Figure 1:
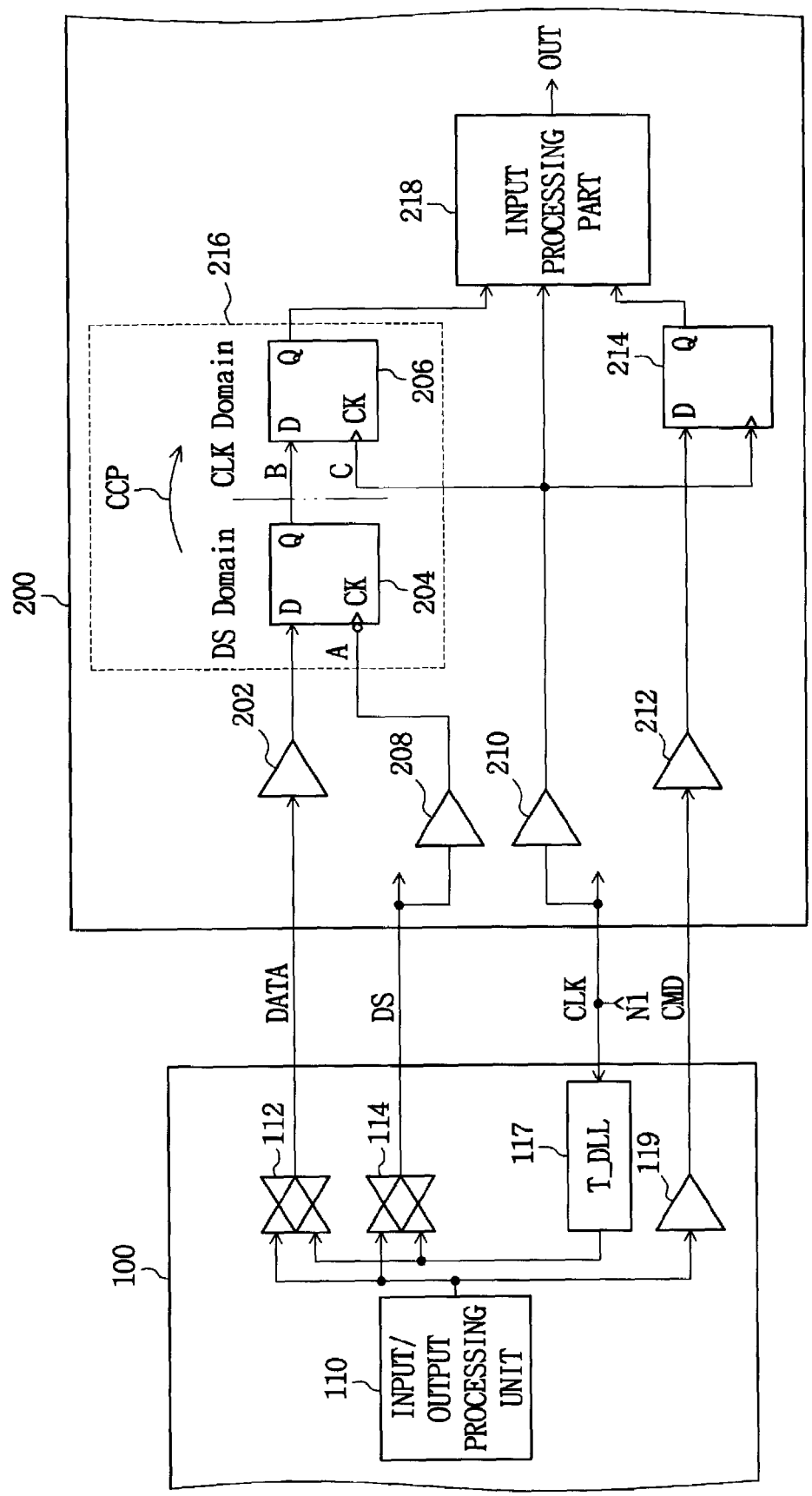
FIG. 1 illustrates a block diagram of a conventional data input-processing unit.

Korean Patent Application No. 2002-22260, filed Apr. 23, 2002, and entitled: "Multi-Clock Domain Input Processing Device Having Clock Signal Receiving Locked Loop and Clock Signal Input Method Thereof," is incorporated by reference herein in its entirety.

Hereinafter, an on-die termination control method and the related control circuit will be described according to embodiments of the present invention with reference to the accompanying drawings. Like reference numerals are used for designation of like or equivalent parts or portions having similar or identical functions throughout the drawings.

Figure 7:
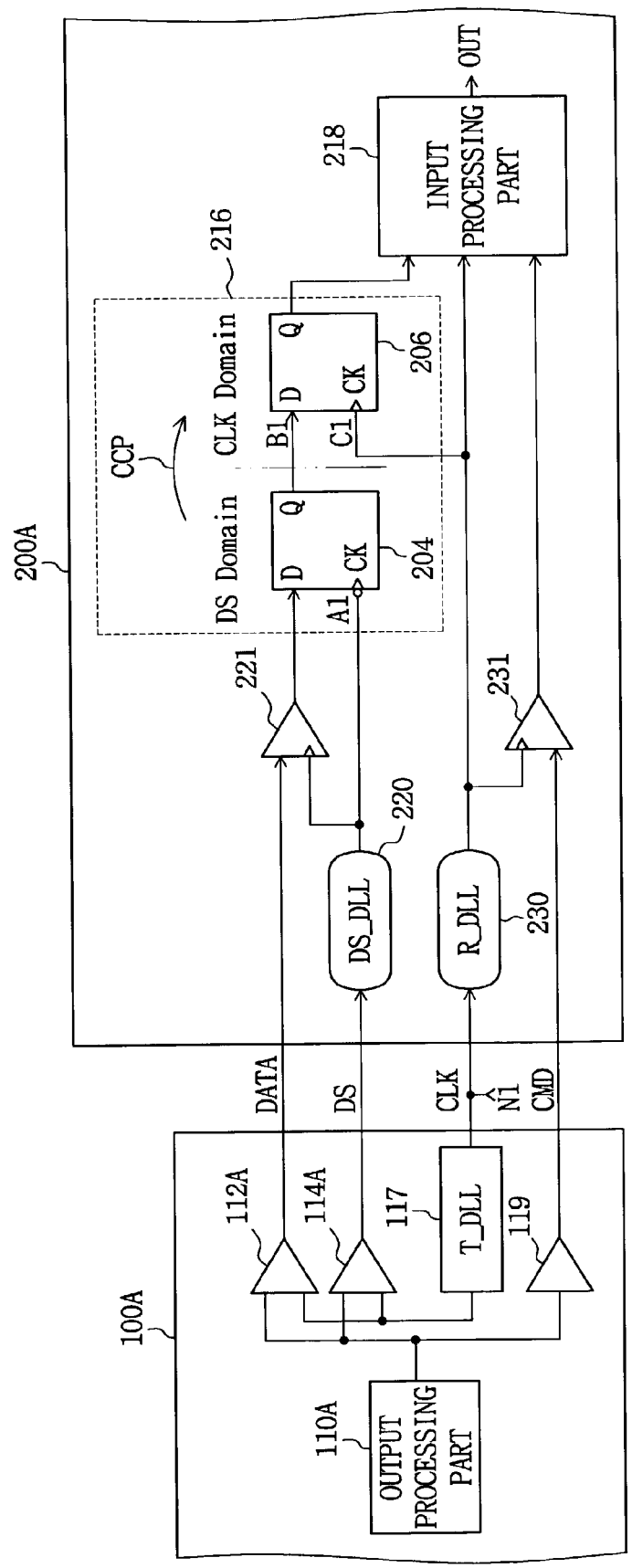
FIG. 7 illustrates a block diagram of a conventional data input-processing unit having a signal-receiving delay locked loops.
Figure 8:
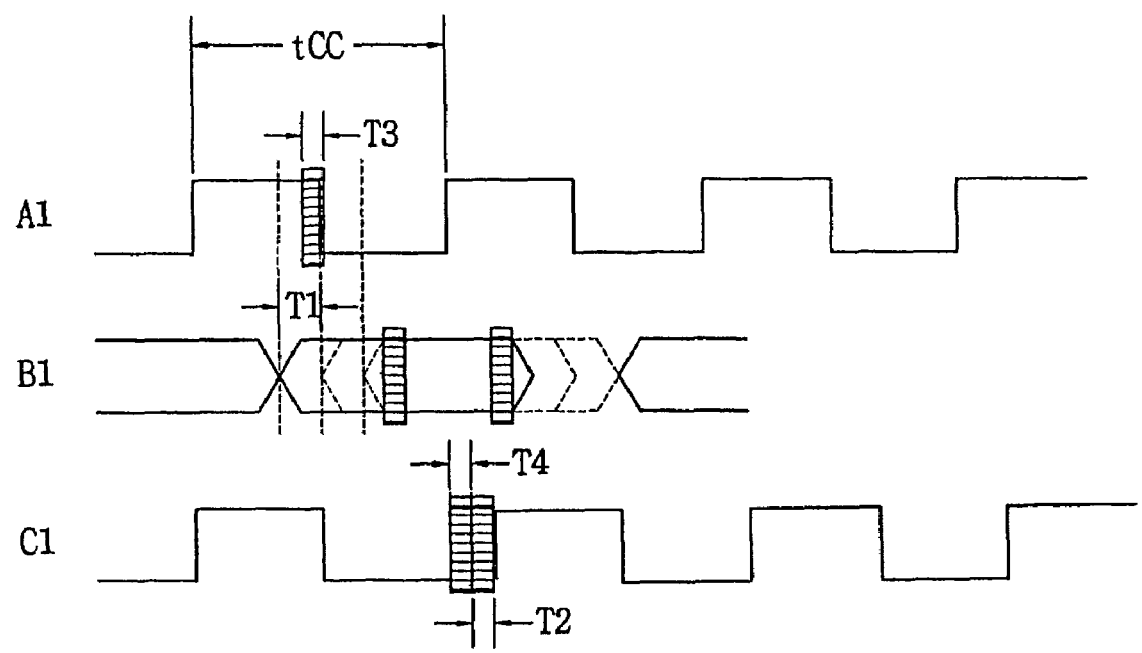
FIG. 8 illustrates an operational timing diagram of the data input unit shown in FIG. 7.

FIG. 7 illustrates a block diagram of a conventional data input-processing unit having a signal-receiving delay locked loops (DLLs). FIG. 8 illustrates an associated operational timing diagram.

The data input-processing unit shown in FIG. 7, includes signal-receiving Delay Locked Loop (R_DLL) 230 and Data Strobe Delay Locked Loop (DS_DLL) 220 at a second processing block 200A in a system having a free-running unidirectional data strobe function for high frequency operations. For convenience, the second block 200 and the first block 100 are respectively defined as a data input-processing unit adapted to a SDRAM and a CPU or a memory controller. Data provided by an output processing part 110A of the memory controller 100A is applied to a receiver 221 of a data input-processing unit 200A through a signal-transmitting buffer 112A, and a data strobe signal DS provided by the output processing part 110A is applied to DS_DLL 220 through a signal-transmitting buffer 114A. Also, a command signal CMD provided by the output processing part 110A is applied to a receiver 231 through a signal-transmitting buffer 119. A clock signal CLK is applied from an input node N1 to R_DLL 230. The input operations of a signal-receiving clock conversion part CCP, which uses multi-clock domain, are performed in a data input part 216, which is constructed via the connection of first and second latches 204 and 206, respectively. First latch 204 latches data received through the receiver 221 in response to a data strobe signal received at a clock terminal of first latch 204 through the DS_DLL 220, and the second latch 206 latches data from an output terminal Q of the first latch 204 in response to a clock signal CLK received at a clock terminal of second latch 206 through the R_DLL 230.

A timing margin in the signal-receiving clock conversion part CCP is described with reference to FIG. 8, which shows signal timing at clock terminal CK and input terminal D of the first and second latches 204 and 206. As shown in FIG. 8, when a data strobe signal DS is applied through DS_DLL 220 as waveform A1 having a time delay T3 caused by DS_DLL 220, the output terminal Q of the first latch 204 (data waveform B1) is delayed by as much as a time delay T1 relative to waveform A1. This is due to data waveform B1 being applied to the receiver 221 in synchronization with a signal-transmitting clock CLK propagating through a signal-transmitting delay locked loop T_DLL 117. On the other hand, the clock signal applied to the second latch 206 is clock signal CLK propagating through R_DLL 230 and is represented as waveform C1. Thus, there exists in waveform C1 a time delay T2, which is caused by a mismatch between the paths of clock signal CLK and data strobe signal DS, and a time delay T4 associated with R_DLL 230. As a result, a standard tDQSS showing a difference in the timing between data strobe signal and clock signal is given as a value obtained by subtracting the total value of time intervals T1, T2, T3, T4 from a time interval tCC, which represents one period of the clock signal CLK. In other words, tDQSS=tCC−(T1+T2+T3+T4).

For high frequency operations, clock signals of signal-transmitting and receiving parts are typically generated through respective DLLs. Additionally, the unidirectionally applied data strobe signal DS is also generated through DS_DLL 220. In the structure of a conventional data input-processing unit, such as that shown in FIG. 7, maximizing the timing estimation causes the timing margin of the signal-receiving clock conversion part CCP to be less than that of a unit that does not use an element, such as R_DLL 230 or DS_DLL 220.

As a result, in order to keep the standard tDQSS within a predetermined regulated range for a DDR-SDRAM or other data input-processing unit, the timing margin of the signal-receiving clock conversion part CCP should be maximized. Disadvantageously, since it is difficult to perform high frequency operations without the use of elements R_DLL 230 or DS_DLL 220, it is necessary to obtain a timing margin in the clock conversion part CCP via the application of R_DLL or DS_DLL.

Figure 9:
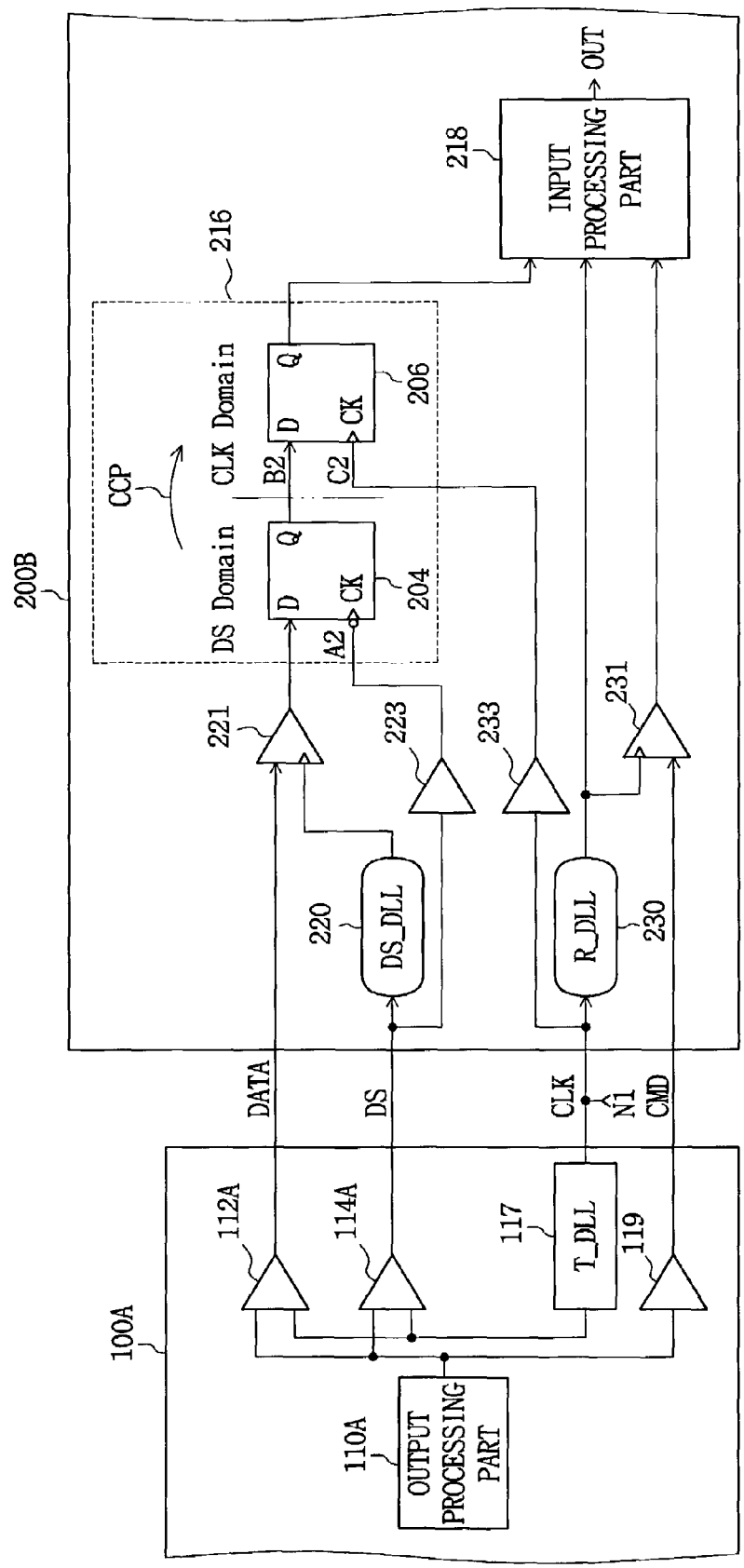
FIG. 9 illustrates a block diagram of a data input-processing unit having a signal-receiving delay locked loops according to a preferred embodiment of the present invention.
Figure 11:
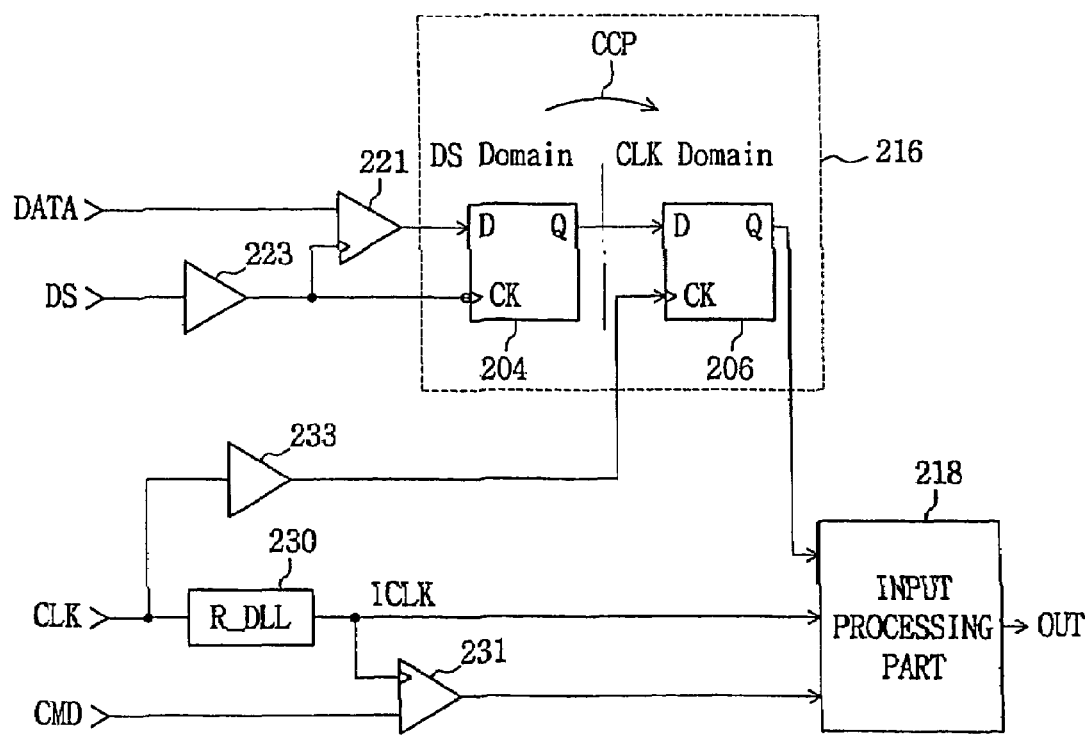
FIG. 11 illustrates a block diagram of a data input-processing unit having a signal-receiving delay locked loop according to a second embodiment of the present invention.
Figure 12:
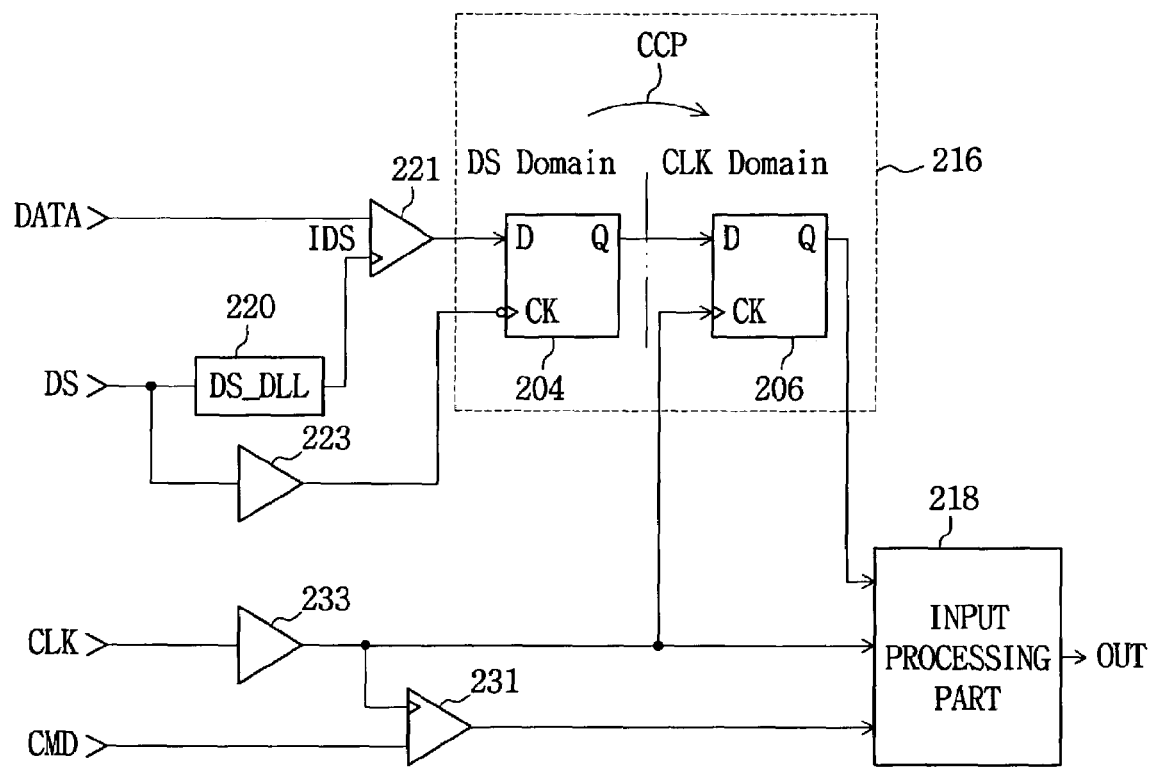
FIG. 12 illustrates a block diagram of a data input-processing unit having a signal-receiving delay locked loop according to a third embodiment of the present invention.

A data input-processing unit and an improved clock signal applying method preferably produce a satisfactory timing margin in a signal-receiving clock conversion part CCP even when signal-receiving DLLs (R_DLL 230 and DS_DLL 220) are used in a data input part 216 having a high operating frequency. FIGS. 9, 11 and 12 illustrate structures of data input-processing units according to preferred embodiments of the present invention.

Since it is recognized that jitter caused by use of DLL in a signal-receiving part represents a major factor in the degradation of the timing margin, there should be an application of R_DLL 230 or DS_DLL 220 such that the DLLs may be bypassed by clock signal and data strobe signals, respectively, when applied to signal clock conversion part CCP. In other words, to avoid any degradation of the timing margin, a clock CLK or a data strobe signal DS may preferably be applied directly to the signal-receiving clock conversion part CCP when present, while clock or data strobe signal output from the corresponding DLL may be used for all other functional blocks, except for the signal-receiving clock conversion part. The foregoing bypass methods may be selectively performed by separating them from an on-chip DLL or by trading off performance and complexity of DLLs. If capacitance increases excessively, the capacitances may be previously separated at an input pin level thereof.

Hereinafter, preferred embodiments of the present invention will be described in detail with reference to the accompanying drawings.

FIG. 9 illustrates a block diagram of a data input-processing unit having a signal-receiving DLL in accordance with a preferred embodiment of the present invention. The structure of FIG. 9 is similar to the structure of FIG. 7, except for the addition of input buffers 223 and 233, which each have an output connected to a clock terminal of the data input part 216, thereby allowing first and second clocking signals DS, CLK, to be directly applied to the clock terminals of data input part 216 through buffers 223 and 233, bypassing first and second delay locked loops 220 and 230, respectively, while signals outputted from first and second delay locked loops 220 and 230 are applied to all other parts of the data input-processing unit.

In the structure of an input circuit designated as a second processing block 200B, a plurality of clock domains are preferably applied to perform a signal-receiving clock conversion. The first and second delay locked loops 220 and 230 are preferably constructed separately from a signal-transmitting synchronizing circuit to generate the first and second output clock signals synchronously-controlled on basis of the first and second clocking signals DS, CLK that are applied through the first and second buffers 223 and 233, respectively. The aforementioned input circuit may be applied to a data input-processing unit of a synchronous type dynamic random access memory or a data input part of CPU and the like. The data input-processing unit 200B preferably includes: a first receiver 221, which receives write data in response to the first output clock signal of the first delay locked loop 220; a second receiver 231, which receives command CMD in response to the second output clock signal of the second delay locked loop 230; a first latch circuit 204, which latches write data received at the first receiver 221 in response to the first clock signal DS applied when the write data is input; a second latch circuit 206, which latches the latched data output from the first latch circuit 204 in response to the second clock signal CLK applied with a timing different from that of the first clock signal for signal-receiving clock conversion; and an input-processing part 218, which input-processes the latch data output from the second latch circuit 206 in response to the first and second output clock signals applied through the delay locked loops 220, 230.

An output OUT of the input-processing part 218 provides a synchronized write control signal or a data signal for writing data or processing data, respectively. The buffers 223, 233 may be implemented to provide for the conversion of clock signals from one type to another, such as converting a TLL level being to a CMOS level. Similarly, receivers 221 and 231 may also include a level conversion architecture (i.e., being constructed using CMOS clocked inverters.) The first and second latches 204 and 206, respectively, may be D-flipflops.

Figure 2:
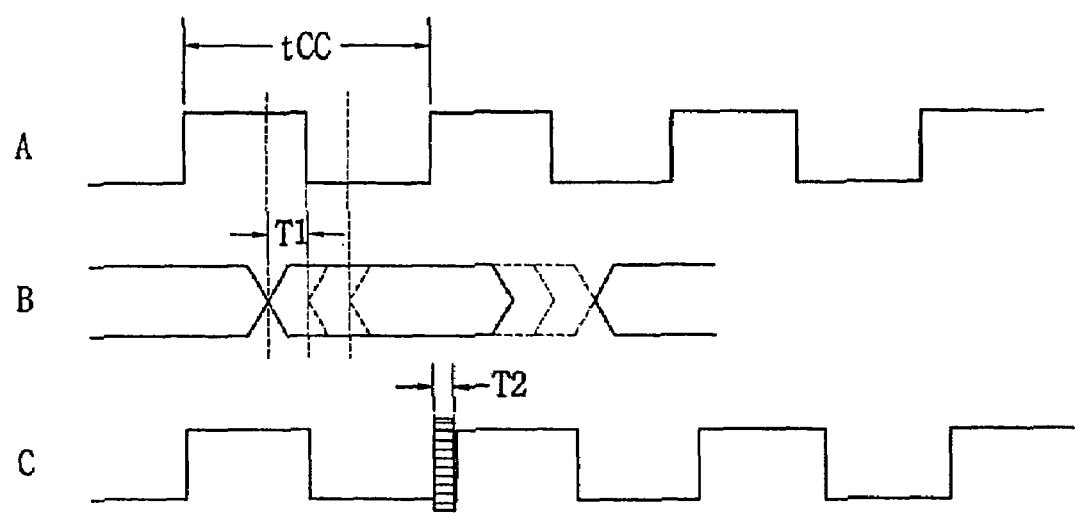
FIG. 2 illustrates an operational timing diagram of the data input unit shown in FIG. 1.
Figure 3:
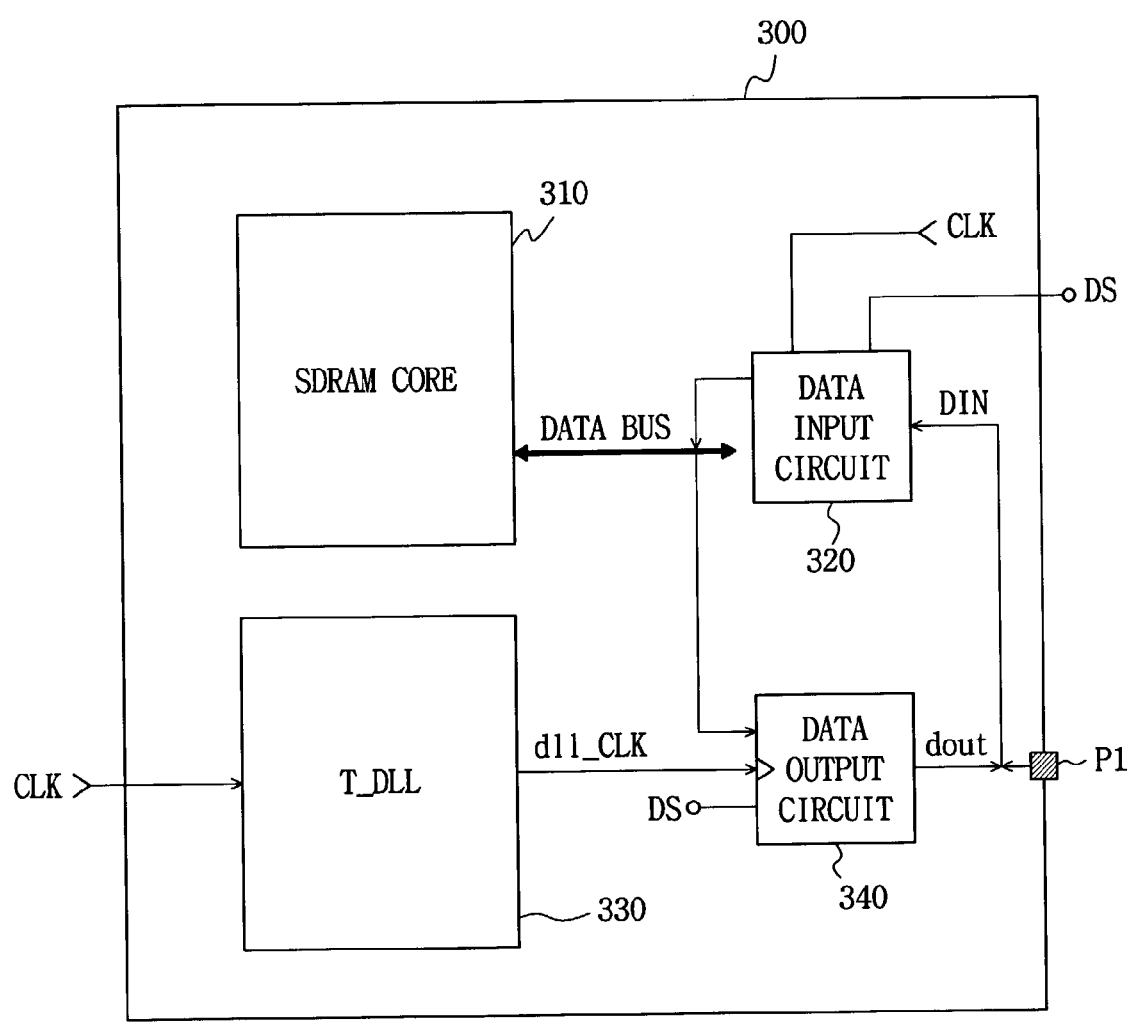
FIG. 3 illustrates a block diagram of a conventional synchronous semiconductor memory device having a signal-transmitting delay locked loop.
Figure 4:
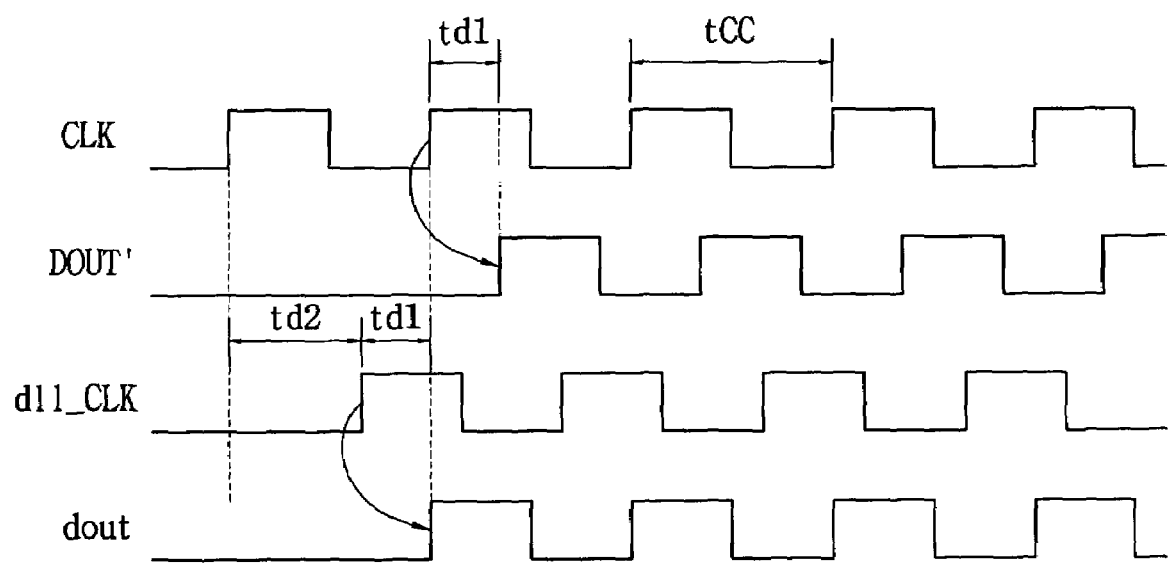
FIG. 4 illustrates a timing diagram of data output operation showing the function of the signal-transmitting delay locked loop shown in FIG. 3.
Figure 5:
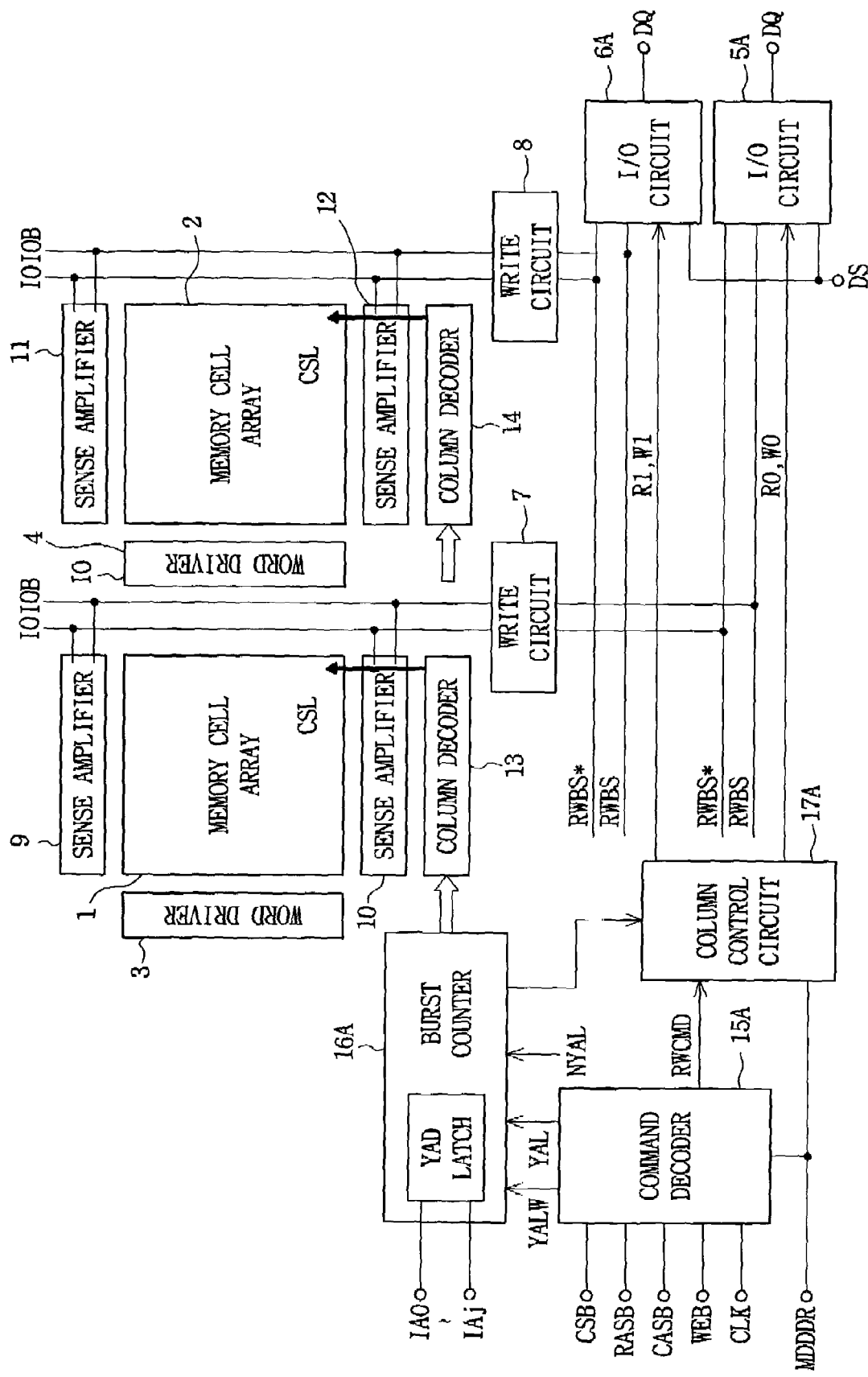
FIG. 5 illustrates a block diagram of a conventional double data rate synchronous random access memory.
Figure 6:
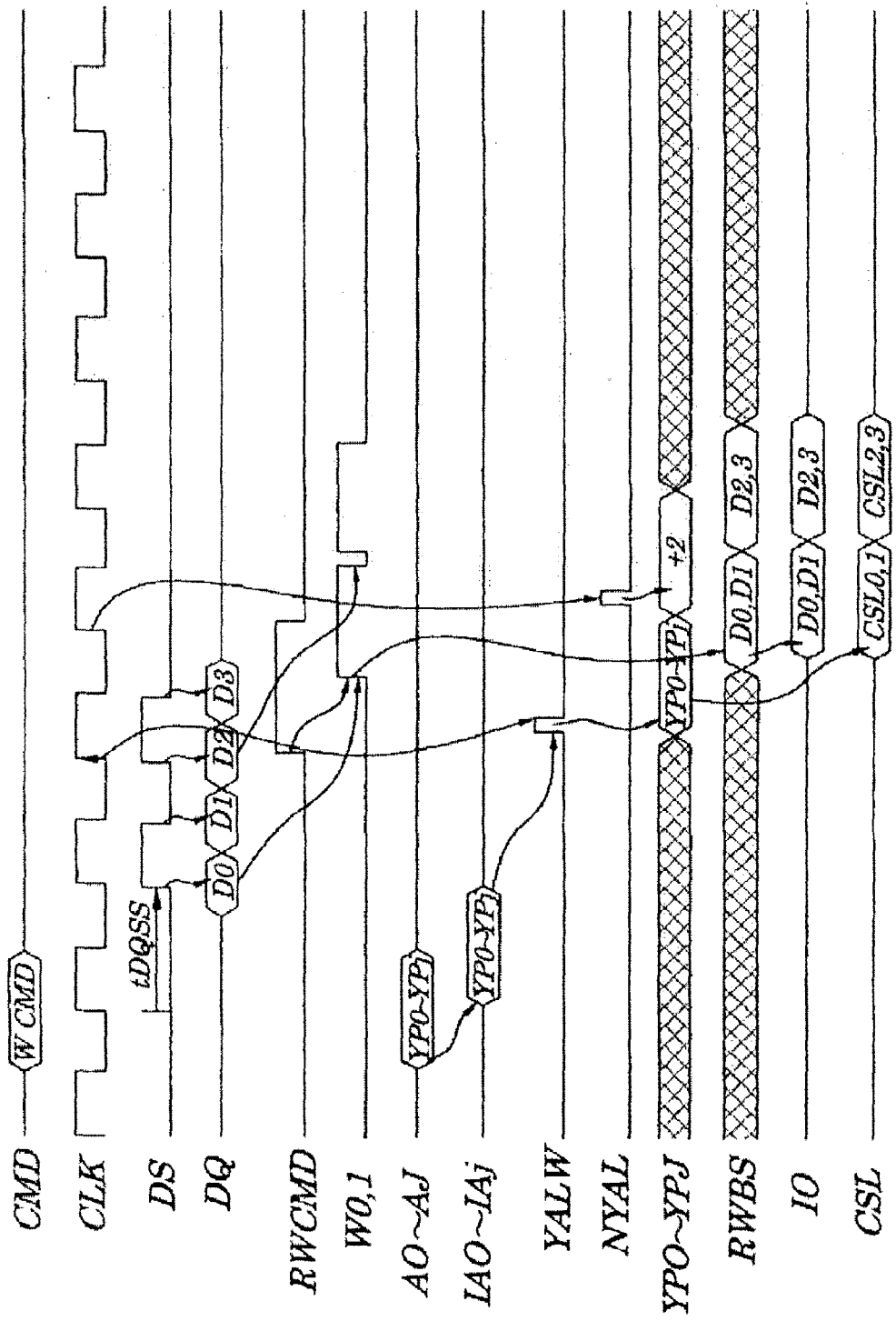
FIG. 6 illustrates an operational timing diagram showing the write operations of the synchronous random access memory shown in FIG. 5.
Figure 10:
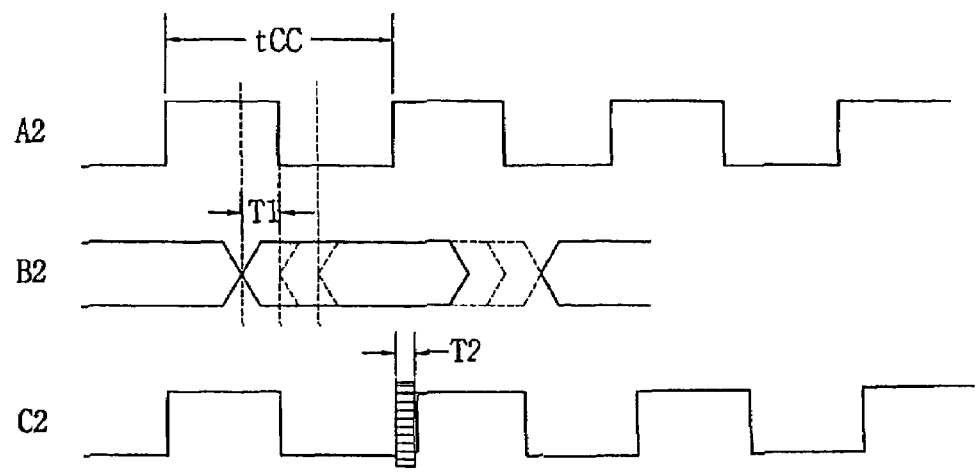
FIG. 10 illustrates an operational timing diagram of the data input unit shown in FIG. 9.

FIG. 10 illustrates an operation timing diagram of the data input part shown in FIG. 9 with waveforms A2, B2, C2, which are similar to waveforms A1, B1, C1 in FIG. 8. By incorporating the embodiment of the present invention, tDQSS=tCC−(T1+T2), since the time delay intervals T3, T4 of FIG. 8 are eliminated. In other words, despite the use of DS_DLL 220 and R_DLL 230, the operation timing diagram of FIG. 10 is identical to that of FIG. 2, thus providing a timing margin that is adequate for high frequency operations.

If the data input part 216 of the present invention is used in a DDR-SDRAM, the latch circuits 204 and 206 are preferably implemented as a three-level shift register and two-level register, respectively, for high-speed processing operations. Serial data signals that are input to the three- or two-level registers are preferably converted to parallel, in order to improve high-speed processing. As in the previous D-flipflop embodiment, data write signals are preferably primarily latched by synchronizing with the rising and falling edges of a data strobe signal and then secondarily latched by synchronizing with a clock signal at the following latch.

FIG. 11 illustrates a block diagram of a data input-processing unit having a signal-receiving DLL in accordance with a second embodiment of the present invention. As shown in FIG. 11, the data input-processing unit includes a clock signal-receiving synchronous circuit R_DLL 230 which generates a signal-receiving internal clock ICLK as an output clocking signal. By phase-delaying the second clock signal CLK by a predetermined time; a data input part 216 inputs data in sequential response to the first clocking signal DS that is applied simultaneously with the application of the data and to the second clocking signal CLK that is applied at a timing different from that of the first clock signal DS. An input-processing part 218 processes the data output from the data input part 216 in response to the signal-receiving internal clock ICLK of the clock signal-receiving synchronous circuit (clock signal receiving locked loop) R_DLL 230.

The structure of FIG. 11 preferably includes only a clock signal-receiving synchronous circuit R_DLL 230 for controlling the phase of a signal-receiving clock in an input circuit, rather than the R-DLL 230 and DS_DLL 220 combination as in the preferred embodiment. A clock CLK received from an external source is preferably directly applied through a buffer 233 to the signal-receiving clock conversion part CCP. The signal-receiving internal clock ICLK output from the clock signal-receiving synchronous circuit R_DLL 230 is supplied to the input-processing part 218 and a receiver 231. As a result, despite the use of R_DLL 230, an adequate timing margin is provided for high frequency operations.

FIG. 12 illustrates a block diagram of a data input-processing unit having a signal-receiving DLL according to a third embodiment of the present invention. The structure includes only DS_DLL 220 rather than the R_DLL 230 and DS_DLL 220 combination of the preferred embodiment. As in the other embodiments, the clocking signal bypasses the DS_DLL 220, and externally received data strobe signal DS is directly applied to the signal-receiving clock conversion part CCP through a buffer 223.

Figure 13:
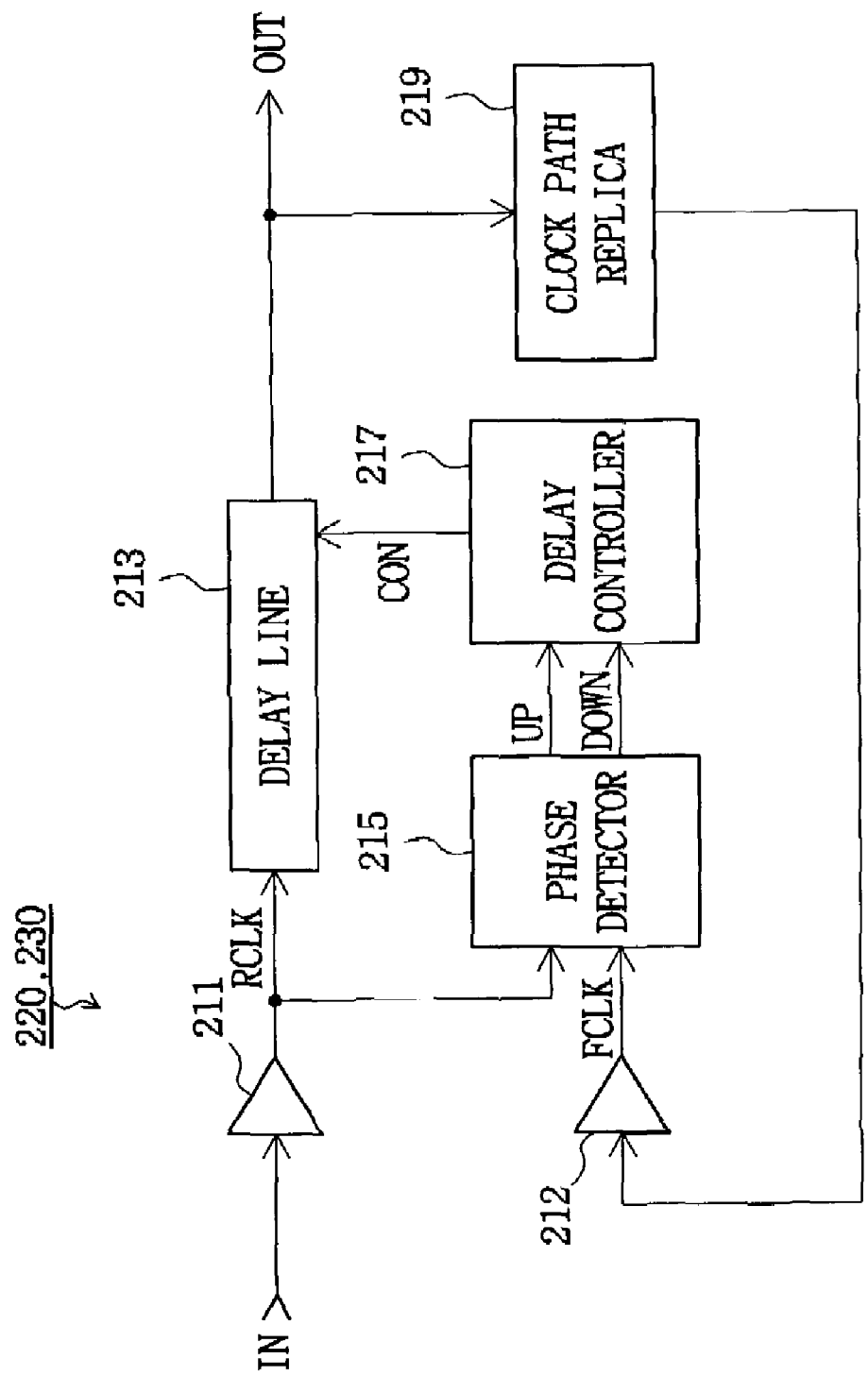
FIG. 13 illustrates a block diagram of a delay locked loop according to the present invention.
Figure 14:
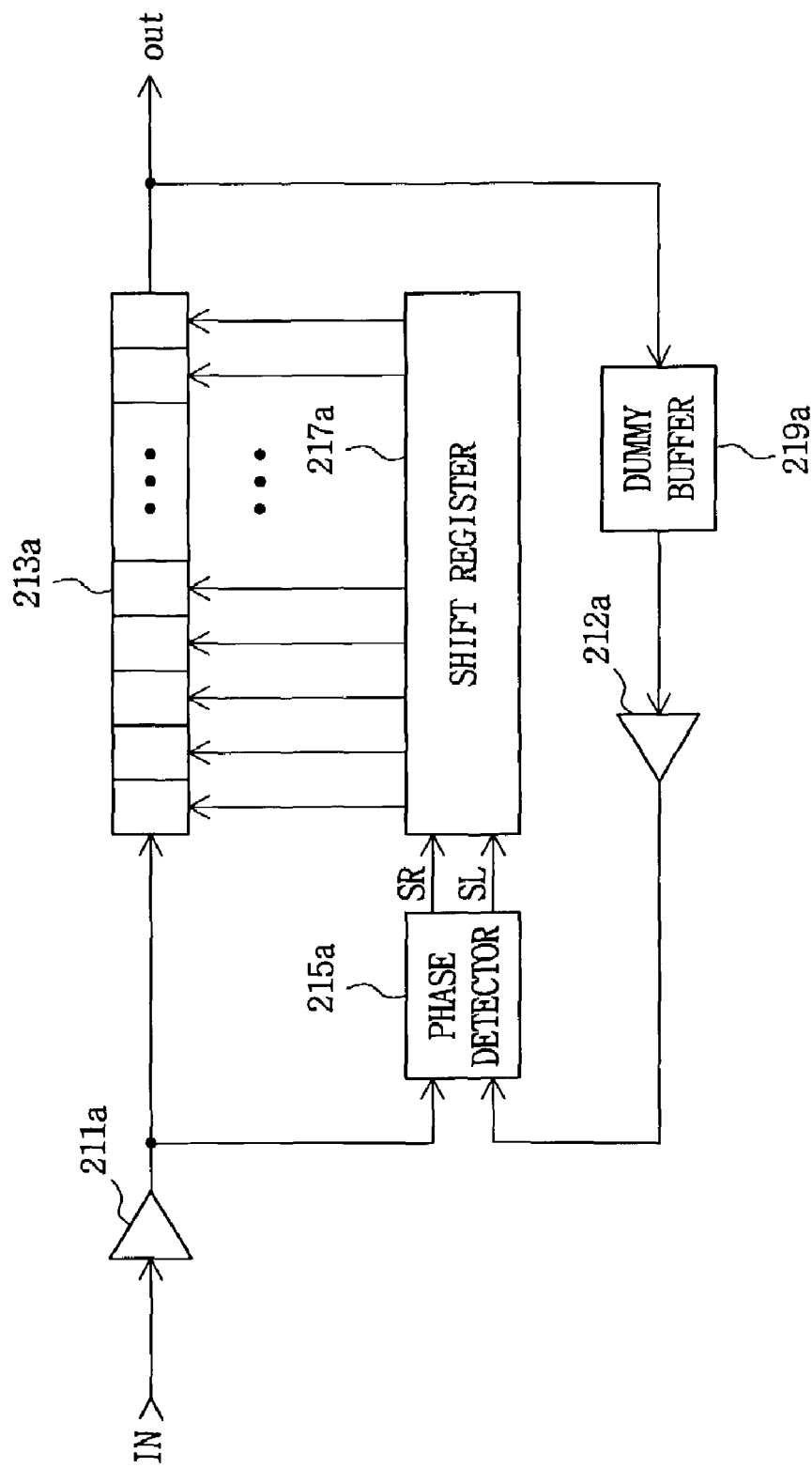
FIG. 14 illustrates an exemplary diagram of a delay locked loop constructed according to FIG. 13.

FIGS. 13 and 14 illustrate representative DLLs, such as R_DLL 230 and DS_DLL 220 shown in FIGS. 9, 11 and 12. As shown in FIG. 13, a DLL (i.e., 220, 230) may include: a signal-receiving buffer 211, which receives an input clock signal IN; a variable delay unit 213, which outputs an output clock signal OUT by delaying a signal-receiving clock signal RCLK output from the signal-receiving buffer 211 in response to an applied digital control data CON; a phase detector 215, which detects a difference in the phase between signal-receiving clock signal RCLK and feedback clock signal FCLK to generate shifting control signals UP, DOWN; and a delay control part 217, which supplies to the variable delay unit 213 the digital control data CON to increase or decrease the amount of delay in response to the shifting control signal of the phase detector 215. Also, the DLL 220, 230 preferably includes a clock path replica 219 to generate the feedback clock signal FCLK using the output clock signal OUT and a dummy signal-receiving buffer 212. The time delay of the dummy signal-receiving buffer 212 is preferably the same as that of the signal-receiving buffer 211.

FIG. 14 illustrates an exemplary diagram of a DLL, which includes a signal-receiving buffer 211a; a delay unit 213a; a phase detector 215a, which generates a shifting control signal SR, SL to indicate shift-right or shift-left operations; a shift register 217a, which controls the delay unit 213a. The shift register 217a provides the digital control data to increase or decrease the amount of time delay in response to the shifting control signal of the phase detector 215a; a dummy buffer 219a and a dummy signal-receiving buffer 212a. Preferably, the delay amount of the dummy signal-receiving buffer 212a is the same as that of the signal-receiving buffer 211a, and the delay amount of the dummy buffer 219a is the same as that of a buffer (not shown) using the output clock signal.

The function of a data input/output (I/O) block is dependent on the design of the DLL which generates an internal clock. Although, a phase locked loop (PLL) may also be used for clock generation, DLL is generally used when a clock frequency does not have to be multiplied, as in DRAM since a DLL typically has less jitter than a PLL. A variable delay line, such as delay unit 213a, which controls delay time is the primary determinate of the characteristics of the DLL. The variable delay line may use one of three methods, as follows: varying the delay of each delay cell using an analog method; controlling the number of delay cells; and controlling the number of delay cells for coarse locking and varying the delay of each delay cell using the analog method for fine locking. The first method is widely used, but has a disadvantage of a small operational frequency range. The second method has advantages of ease of control and of storage of the locking data as a digital value, but has a disadvantage of poor resolution, which results in a large jitter. The third method, which is more complex, provides wide operational frequency range using the advantages of the other two methods.

The phase detector 215a monitors a phase difference between two clocks, the magnitude of static skew, bang-bang jitter, and the like. The phase detector 215a may be implemented using D-flipflop (D-F/F). However, there is an uncertainty window relating to a setup/hold window of the D-F/F, which increases jitter. Additionally, there is a disadvantage of generating bang-bang jitter in the D-F/F of the phase detector because it determines only that the phase error is positive or negative. The dummy buffer 219a is preferably adapted as an alternative to harmonic locking.

There may be a restriction on locking time depending on the applications of the DLL. For instance, a DDR-SDRAM should typically complete locking within 200 cycles. In a case of an open-loop type DLL representing a synchronous mirror delay, the locking may be completed only in two cycles, but it is difficult to guarantee the period of locking time with a closed loop type of a general DLL. The most common method of reducing the period of locking time is to sequentially perform coarse locking at a high speed followed by a fine locking procedure.

The DDR-SDRAM has a very wide operational frequency range of tCK=7 ns–15 ns, so that DLL is generally constructed to control the time delay hierarchically. In considering power dissipation, a digital DLL may be used to store locking data as digital codes. Preferably, a DLL is not being operated when the DLL is not needed, thereby reducing power consumption.

Figure 15:
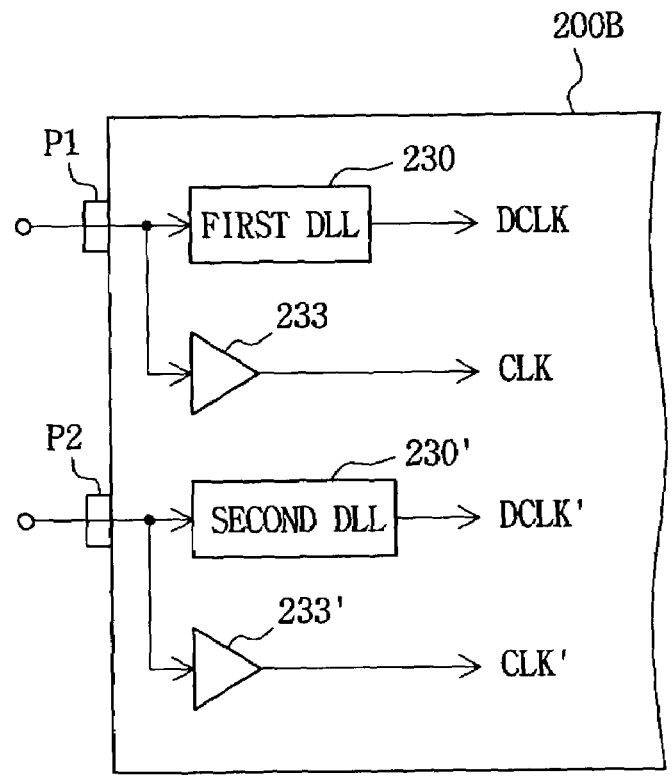
FIGS. 15 through 17 illustrate exemplary block diagrams of circuits for separating clock signals during conversion of a signal-receiving clock in accordance with the present invention.
Figure 16:
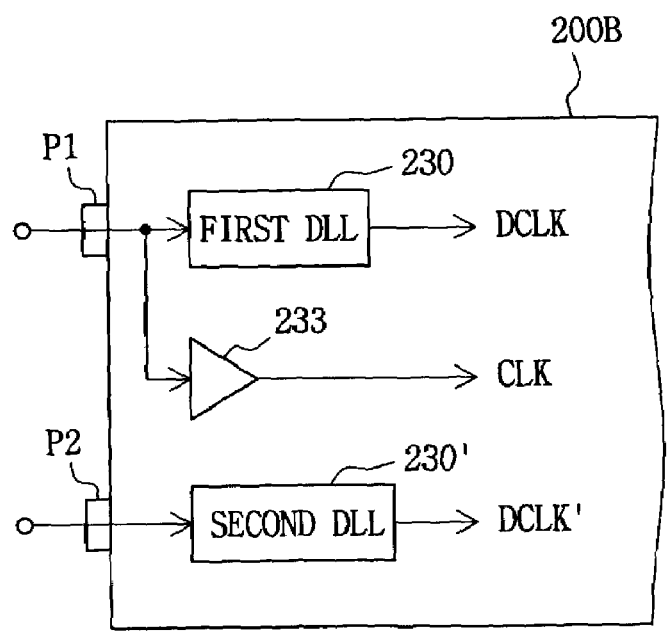
Figure 17:
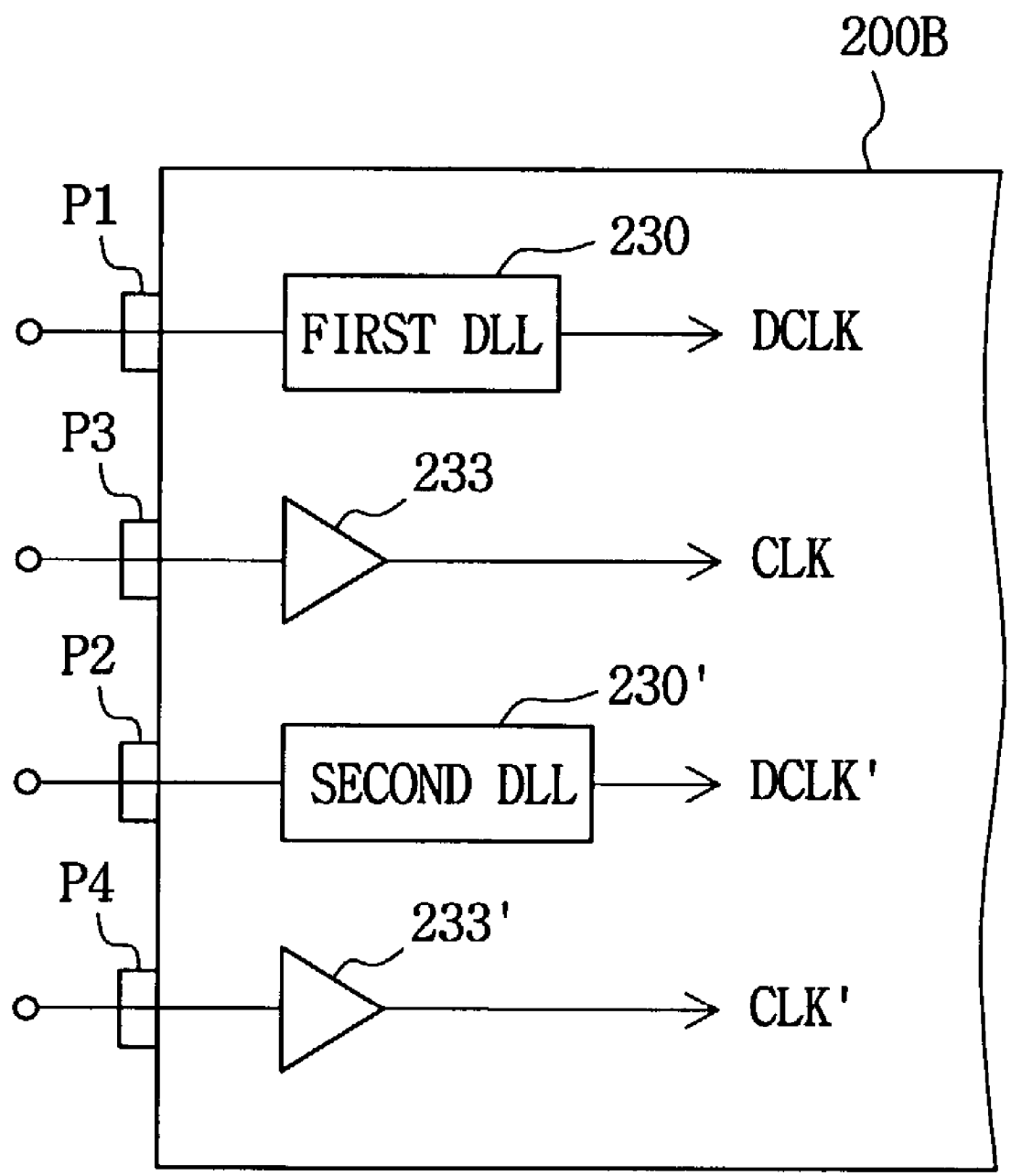

FIGS. 15 through 17 illustrate block diagrams of exemplary circuits for separating clock signals during signal-receiving clock conversion in accordance with the present invention.

As shown in FIG. 15, the first and second DLLs 230, 230', respectively, are preferably included in the data input-processing unit 200B, and direct clock signals CLK, CLK' are obtained through buffers 233 and 233' correspondingly connected to the input terminals of the first and second DLLs 230, 230', respectively. Finally, the clock signals input to the input terminals of the first and second DLLs 230, 230' are directly separated through clock input pins P1, P2 on the on-chip.

As shown in FIG. 16, the performance and complexity of DLL may be traded off in the structure for selective bypass, (i.e., it illustrates a selective structure). In other words, when the first and second DLLs 230 and 230', respectively, are included in the data input-processing unit 200B, a direct clock signal CLK is obtained only at the input terminal of the first DLL 230 if the performance of the second DLL 230' is more favorable than that of the first DLL 230.

As shown in FIG. 17, clocks may be separated at the pin level to avoid an extreme increase in capacitance. In the structure of FIG. 17, clock signals CLK, CLK' to be directly used are input through pins P3, P4, respectively, and clock signals to be applied to the first and second DLLs 230, 230' are input through pins P1, P2, respectively.

In any of the structures shown in FIGS. 15 through 17, it is preferable according to the present invention that clock signal or data strobe signal bypass the DLL and be applied directly to the clock conversion part. It is apparent that various changes may be made in the specifications of the method for applying clock signals or the detailed connection structure of an input circuit.

As described above, there are advantages in the multi-clock domain data input-processing unit having clock signal-receiving locked loop and the related clock signal applying method in that a plurality of clock signals are directly applied only to the signal receiving clock conversion part. The clock signals output from the delay locked loop are preferably applied to all the remaining parts of the data input-processing unit, except the signal-receiving clock conversion part, thereby securing a maximized timing margin at the clock conversion part and significantly reducing restrictions for high-speed operations. Thus, the operational speed of the semiconductor memory device is significantly improved by application of the multi-domain data input-processing unit according to the present invention.

Several embodiments, including a preferred embodiment, of the present invention have been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A data input-processing unit comprising:
   a clock signal-receiving synchronous circuit that generates an output clock signal by phase-delaying a first clock signal by a predetermined time;
   a data input part that inputs data in sequential response to the first clock signal applied when data is applied and a second clock signal having a timing different from that of the first clock signal, the first clock signal being applied to the data input part without passing through the clock signal-receiving synchronous circuit; and
   an input-processing part that processes data output from the data input part using the output clock signal of the clock signal-receiving synchronous circuit and the second clock signal.

2. The data input-processing unit as claimed in claim 1, wherein, if the first clock signal is a data strobe signal applied from outside, the second clock signal is an external clock signal.

3. The data input-processing unit as claimed in claim 1, wherein the data input part comprises:
   a first latch, which latches the data in response to the first clock signal; and
   a second latch, which latches the data output from the first latch in response to the second clock signal.

4. A data input-processing unit comprising:
   a clock signal-receiving synchronous circuit that generates a signal-receiving internal clock as an output clock signal by phase-delaying a first clock signal by a predetermined time;
   a data input part that inputs data in sequential response to the first clock signal applied when data is applied and a second clock signal having a timing different from that of the first clock signal, the first clock signal being applied to the data input part without passing through the clock signal-receiving synchronous circuit; and
   an input-processing part that processes data output from the data input part using the signal-receiving internal clock of the clock signal-receiving synchronous circuit.

5. The data input-processing unit as claimed in claim 4, wherein, if the first clock signal is a data strobe signal applied from outside, the second clock signal is an external clock signal.

6. The data input-processing unit as claimed in claim 4, wherein the data input part comprises:
   a first latch, which latches the data in response to the first clock signal; and
   a second latch, which latches the data output from the first latch in response to the second clock signal.

7. The data input-processing unit as claimed in claim 4, wherein the clock signals applied to the data input part are applied directly without passing through the clock signal-receiving synchronous circuit and the clock signals applied to the input-processing part pass through the clock signal-receiving synchronous circuit.

8. A data input-processing unit comprising:
   a clock signal-receiving synchronous circuit constructed having a first delay lock loop that generates a first output clock signal by phase-delaying a first clock signal applied, when data is applied, by a predetermined time and a second delay lock loop that generates a signal-receiving internal clock as a second output clock by phase-delaying a second clock signal applied having a timing different from that of the first clock signal;
   a data input part which inputs data in sequential response to the first clock signal directly applied without passing through the clock signal-receiving synchronous circuit; and
   an input-processing part that processes the data output from the data input part with the first and second output clocks of the clock signal-receiving synchronous circuit.

9. The data input-processing unit as claimed in claim 8, wherein, if the first clock signal is a data strobe signal applied from outside, the second clock signal is an external clock signal.

10. The data input-processing unit as claimed in claim 8, wherein the data input part comprises:
    a first latch, which latches the data in response to the first clock signal; and
    a second latch, which latches the data output from the first latch in response to the second clock signal.

11. The data input-processing unit as claimed in claim 8, is a double data rate synchronous dynamic random access memory having a free-running data strobe function.

12. A clock signal applying method for a data input-processing unit to which a plurality of clock domains are applied, which has a data signal-receiving part having a delay locked loop installed for at least one clock signal, comprising:
    directly applying a plurality of clock signals only to a signal-receiving clock conversion part of the data input-processing unit; and
    applying a clock signal output from the delay locked loop to remaining parts of the data input-processing unit, other than the signal-receiving clock conversion part.

13. The method as claimed in claim 12, wherein the plurality of clock signals are independently applied from outside of a chip of the data input-processing unit.

14. The method as claimed in claim 12, wherein the plurality of clock signals are applied after being separated at input terminals of the delay locked loop installed at an internal part of the chip of the data input-processing unit.

15. A synchronous dynamic random access memory having a clock signal-receiving synchronous circuit for signal-receiving synchronous control formed separately from a signal-transmitting synchronous circuit, and an input circuit, the input circuit comprising:
- a first latch circuit, which latches a write data signal in response to a first clock signal applied when the write data signal is applied during a write operational mode;
- a second latch circuit, which latches the latched data output from the first latch circuit in response to a second clock signal having a timing different from the first clock signal for a signal-receiving clock conversion, wherein at least one of the first clock signal applied to the first latch circuit and the second clock signal applied to the second latch circuit does not pass through the clock signal-receiving synchronous circuit; and
- an input-processing part, which processes the latched data output from the second latch circuit in response to an output clock signal synchronously controlled on the basis of the second clock signal through the clock signal-receiving synchronous circuit.

16. The memory as claimed in claim 15, wherein, if the first clock signal is a data strobe signal applied from outside, the second clock signal is an external clock signal.

17. The memory as claimed in claim 15, wherein the clock signal-receiving synchronous circuit includes a phase synchronizing loop or delay locked loop which generates a signal-receiving internal clock as an output clock signal by phase-delaying the second clock signal by a predetermined time.

18. A synchronous dynamic random access memory having a clock signal-receiving synchronous circuit for signal-receiving synchronous control formed separately from a signal-transmitting synchronous circuit, and an input circuit, the input circuit comprising:
- a first latch circuit, which latches a write data signal in response to a first clock signal applied when the write data signal is applied during a write operational mode;
- a second latch circuit, which latches the latched data output from the first latch circuit in response to a second clock signal having a timing different from the first clock signal for a signal-receiving clock conversion, wherein at least one of the first clock signal applied to the first latch circuit and the second clock signal applied to the second latch circuit does not pass through the clock signal-receiving synchronous circuit; and
- an input-processing part which processes the latched data output from the second latch circuit in response to an output clock signal synchronously controlled on the basis of the first clock signal through the clock signal-receiving synchronous circuit.

19. A synchronous dynamic random access memory having a clock signal-receiving synchronous circuit for signal-receiving synchronous control formed separately from a signal-transmitting synchronous circuit, and an input circuit, the input circuit comprising:
- a first latch circuit, which latches a write data signal in response to a first clock signal applied when the write data signal is applied during a write operational mode;
- a second latch circuit, which latches the latched data output from the first latch circuit in response to a second clock signal having a timing different from the first clock signal for a signal-receiving clock conversion, wherein at least one of the first clock signal applied to the first latch circuit and the second clock signal applied to the second latch circuit does not pass through the clock signal-receiving synchronous circuit; and
- an input-processing part, which processes the latched data output from the second latch circuit in response to an output clock signal synchronously controlled on the basis of the first and second clock signals through the clock signal-receiving synchronous circuit.

20. A synchronous dynamic random access memory having first and second delay locked loops, which perform a signal-receiving clock conversion with application of a plurality of clock domains and generate first and second output clock signals synchronously controlled on the basis of first and second clock signals applied through first and second buffers, respectively, the loops constructed separately from a signal-transmitting synchronous circuit, the loops comprising:
- a first receiver, which receives write data in response to the first output clock signal of the first delay locked loop;
- a second receiver, which receives a command in response to the second output clock signal of the second delay locked loop;
- a first latch circuit, which latches the write data received at the first receiver in response to the first clock signal applied when the write data is input;
- a second latch circuit, which latches the latched data output from the first latch circuit in response to the second clock signal having a timing different from that of the first clock signal for signal-receiving clock conversion; and
- an input-processing part, which input-processes the latched data output from the second latch circuit in response to the first and second output clock signals applied through the delay locked loops.

21. The method as claimed in claim 12, directly applying includes directly applying the plurality of clock signals to all signal-receiving clock conversion part of the data input-processing unit.

* * * * *